(12) United States Patent
Stortz

(10) Patent No.: US 6,806,759 B2
(45) Date of Patent: Oct. 19, 2004

(54) TRI-STATE CHARGE PUMP

(75) Inventor: Kevin Graham Stortz, Crystal Lake, IL (US)

(73) Assignee: Motorola, Inc., Schaumburg, IL (US)

( * ) Notice: Subject to any disclaimer, the term of this patent is extended or adjusted under 35 U.S.C. 154(b) by 1 day.

(21) Appl. No.: 10/317,321

(22) Filed: Dec. 12, 2002

(65) Prior Publication Data

US 2004/0113666 A1 Jun. 17, 2004

(51) Int. Cl.[7] ................................................ G05F 1/10
(52) U.S. Cl. ...................................... 327/536; 327/157
(58) Field of Search .............................. 327/535, 536, 327/534, 537, 148, 157

(56) References Cited

U.S. PATENT DOCUMENTS

| 5,619,161 A | * | 4/1997 | Novof et al. ............... 327/535 |
| 5,638,029 A | * | 6/1997 | O'Shaughnessy ............ 331/44 |
| 6,384,638 B1 | * | 5/2002 | Nayebi et al. ................ 327/65 |
| 6,611,160 B1 | * | 8/2003 | Lee et al. ................... 327/157 |

* cited by examiner

Primary Examiner—Timothy P. Callahan
Assistant Examiner—Cassandra Cox
(74) Attorney, Agent, or Firm—Valerie M. Davis

(57) ABSTRACT

In a device having an integrated circuit ("IC") 310 with a single-pin output (316) at which a tri-state output is generated, a tri-state charge pump (370) is disclosed for extending the IC output range. The charge pump (370) has a switching circuit (320) coupled to an output circuit (340). The charge pump has (370) three modes of operation: 1) source—wherein the switching circuit (320) causes the output circuit (340) to generate a charge current that can be translated into a maximum saturation voltage that is higher than a maximum value generated by the IC; 2) sink—wherein the switching circuit (320) causes the output circuit (340) to generate a discharge current that can be translated into a voltage that is the same as or smaller than a minimum value generated by the IC; and 3) tri-state —wherein the charge pump (370) replicates a tri-state output of the IC.

12 Claims, 2 Drawing Sheets

TRI-STATE CHARGE PUMP

FIELD OF THE INVENTION

The present invention relates generally to charge pumps and more specifically to an external tri-state charge pump for extending the steering line output range of a charge pump that is internal to a synthesizer integrated circuit.

BACKGROUND OF THE INVENTION

Synthesizer integrated circuits ("ICs") are used in a number of different devices. These include two-way radios, wireless personal communication devices, wireless automotive devices, and home and entertainment devices requiring a stable radio frequency to transmit or receive audio, video, and data signals. Some prior art synthesizer ICs have phase detector (or dual) outputs that are used to control existing external charge pump designs for use in applications that require a range of control voltage values. As die shrinks and new processes are developed to reduce IC manufacturing costs, synthesizer IC's with phase detector outputs are being phased out to reduce pin count and package size. The synthesizer ICs with phase detector outputs are being replaced by synthesizer ICs with internal charge pumps. However, current synthesizer ICs with an internal charge pump have a reduced maximum voltage, which may be insufficient for many applications such as high tier base stations, mobile, and portable two-way radios.

FIG. 1 illustrates a simple block diagram of a typical phase locked loop ("PLL") circuit 100, such as may be used in wide range of transmitting and receiving devices described above. PLL circuit 100 comprises a synthesizer IC 110 with an internal charge pump (not shown). Synthesizer IC 110 has a prescaler input 112 and a single pin output 114 that is a steering line output from the internal charge pump. The output signal at output 114 is typically a minimum voltage value, a maximum voltage value or a tri-state output. PLL circuit 100 further comprises an external charge pump circuit 120, having an input 122 coupled to synthesizer output 114, and having an output 124. External charge pump circuit 120 may be, for instance, a prior art external charge pump design or a charge pump circuit in accordance with the present invention. PLL circuit 100 also includes a loop filter 130 coupled to the charge pump output 124. Depending upon the application and circuit arrangement, loop filter 130 may include circuit components such as one or more resistors, and one or more capacitors depending on the order of the filter. In addition, although loop filter 130 is illustrated as being external to charge pump 120, those of ordinary skill in the art will realize that the loop filter may be integrated into the charge pump. Finally, PLL circuit 100 includes a voltage-controlled oscillator ("VCO") 140 coupled between the loop filter 130 and synthesizer input 112 via a VCO feedback circuit 160, and also includes a PLL output 150.

FIG. 2 is a circuit diagram illustrating a PLL circuit 200 having a prior art charge pump circuit. PLL circuit 200 comprises a typical synthesizer IC 210 with an input 212 and an output 214. Synthesizer IC 210 includes an internal charge pump (not shown) that generates a maximum steering line voltage at output 214 that is insufficient for many applications, as noted above. PLL circuit 200 further comprises a prior art external charge pump for extending the steering line range at output 214. This external charge pump includes an operational amplifier ("op-amp") 220, resistors 222 and 224 and a loop filter 230, which includes a resistor 238 and capacitors 232, 234 and 236. The charge pump functions in a voltage mode using op-amp 220 as a voltage-to-voltage converter to generate the increased steering line range. Finally, PLL circuit 200 includes a VCO 240 coupled between op-amp 220 and synthesizer input 212 via a VCO feedback circuit 260, and also includes a PLL output 250.

A shortcoming of the above prior art charge pump is that it requires an op-amp, which is inherently noisy and raises the cost of the device. Another shortcoming of the prior art charge pump design is that although this design is acceptable at room temperatures, it fails over environmental extremes, e.g., humidity, temperature, etc. Still another shortcoming of the prior art charge pump design is that it operates in only two states, and does not address the tri-state output of the synthesizer IC.

Thus, there exists a need for an external charge pump that extends the upper limit of a synthesizer IC's internal charge pump steering line range, that operates over environmental extremes, and that operates to address the tri-state output of the synthesizer IC.

BRIEF DESCRIPTION OF THE FIGURES

A preferred embodiment of the invention is now described, by way of example only, with reference to the accompanying figures in which.

DETAILED DESCRIPTION OF THE PREFERRED EMBODIMENT

Figure 1:
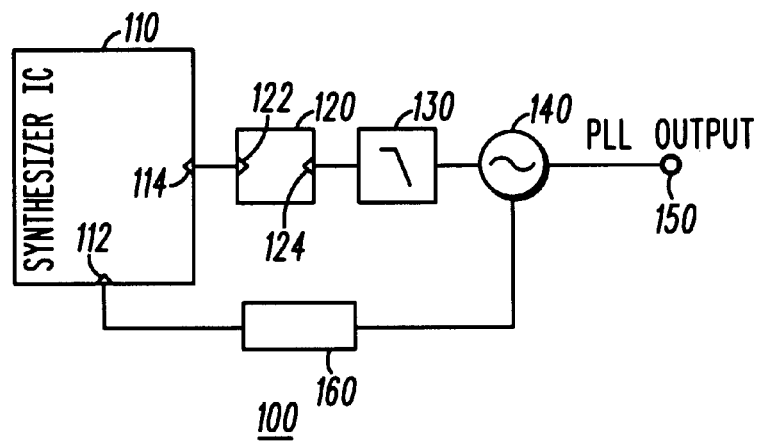
FIG. 1 illustrates a simple block diagram of a phase locked loop that includes an external charge pump circuit, such as a charge pump circuit in accordance with the present invention.

It will be appreciated that for simplicity and clarity of illustration, elements shown in the figures have not necessarily been drawn to scale. For example, the dimensions of some of the elements are exaggerated relative to each other. Further, where considered appropriate, reference numerals have been repeated among the figures to indicate corresponding elements.

Figure 3:
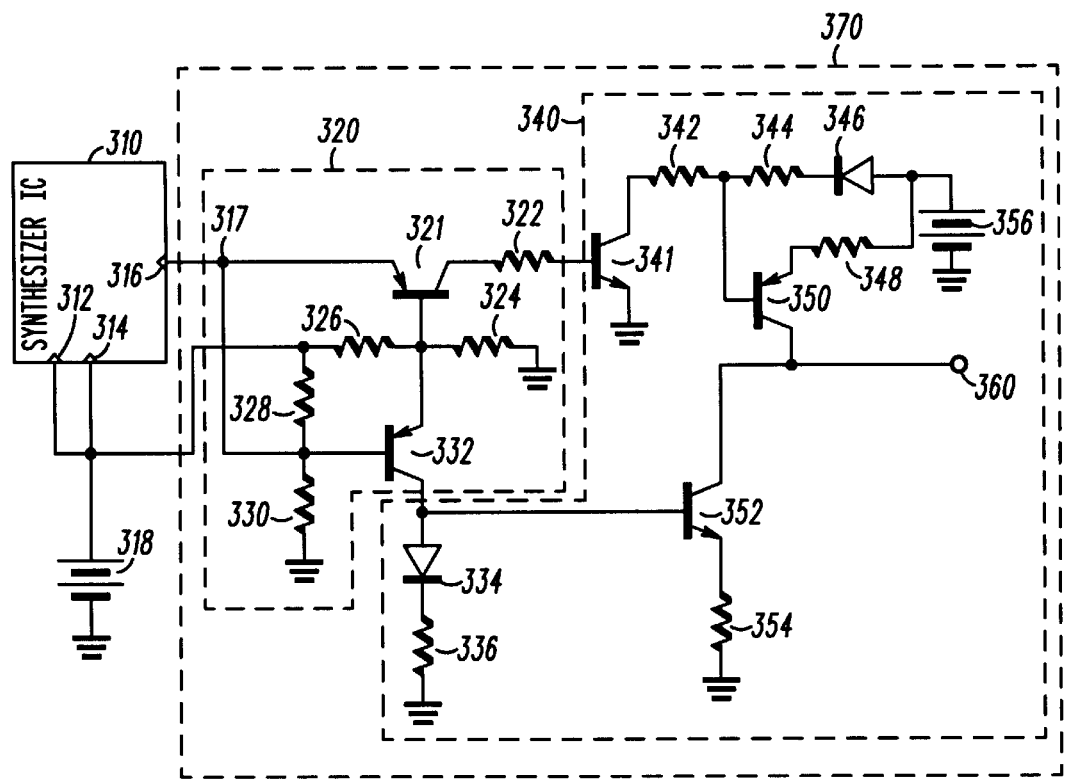
FIG. 3 illustrates a circuit diagram of a tri-state charge pump in accordance with a preferred embodiment of the present invention.

FIG. 3 illustrates a tri-state charge pump 370 in accordance with a preferred embodiment of the present invention that is used to extend the steering line range of an internal charge pump (not shown) of a known synthesizer IC 310. Synthesizer IC 310 has a Vcc input 312 and a voltage input 314 for powering its internal charge pump. In this example Vcc is preferably, but not necessarily, equal to the voltage at input 314 ($V_{314}$), which is a predetermnined direct current ("DC") voltage source 318. The condition Of $V_{CC}=V_{314}$ is selected to reduce voltage requirements. Synthesizer IC 310 also has an output 316 that has three valid modes of operation: 1) Source, wherein a maximum voltage value of about $V_{314}$–0.5V is generated at output 316; 2) Sink, wherein a minimum voltage value of about 0.5V is generated at output 316; and 3) Tri-state, wherein a tri-state output is generated at output 316.

The tri-state charge pump 370 according to the preferred embodiment of the present invention, as illustrated in FIG. 3, comprises a switching circuit 320 coupled to output 316 and an output circuit 340 coupled to the switching circuit 320. The switching circuit 320 of the tri-state charge pump 370 comprises a first circuit for generating a first signal that is a function of the maximum steering line voltage at output 316, and a second circuit for generating a second signal that is a function of the minimum steering line voltage at output 316. This first circuit in the switching circuit 320 preferably includes a transistor 321, which is preferably a PNP type bipolar junction transistor ("BJT"), a resistor 322, and a bias circuit comprising resistors 324, 326, 328 and 330. The second circuit in the switching circuit 320 preferably includes a PNP type BJT transistor 332 and the bias network having resistors 324, 326, 328 and 330.

The output circuit 340 comprises a current source circuit coupled to the first circuit at resistor 322 and configured for operating in an active or inactive state, and a current sink circuit coupled to the second circuit at the collector of transistor 332 and configured for operating in an active or inactive state. The current source circuit of the output circuit 340 preferably comprises a NPN type BJT transistor 341, a PNP type BJT transistor 350, resistors 342, 344, and 348, a diode 346, and a voltage source 356, wherein the first signal generated by the first circuit of the switching circuit 320 is a current that causes the current source circuit of the output circuit 340 to operate in its active state for generating a charge current that can be translated into a first voltage having a value that is larger than the maximum value of the steering line voltage at output 316. The first voltage has a maximum saturation value that is about the same as voltage source 356. The current sink circuit of the output circuit 340 preferably comprises a NPN type BJT transistor 352, a diode 334, a resistor 336, and a resistor 354, wherein the second signal generated by the second circuit of the switching circuit 320 is a current that causes the current sink circuit of the output circuit 340 to operate in its active state for generating a discharge current that can be translated into a second voltage having a value that is about the same as or that is smaller then the minimum value of the steering line voltage at output 316.

The detailed operation of the tri-state charge pump 370 according to the preferred embodiment of the present invention, as illustrated in FIG. 3, is as follows. Preferably, the base voltage of transistor 321 and the emitter voltage of transistor 332 are set to a fixed value that is about equal to $V_{314}/2$, using the voltage divider of resistors 326 and 324. Similarly, the emitter voltage of transistor 321 and the base voltage of transistor 332 are set to a fixed value that is about equal to $V_{314}/2$, using the voltage divider of resistors 328 and 330, for creating a tri-state operation. Now consider the three modes of operation.

Case 1—Source State: The internal charge pump of synthesizer IC 310 will typically source several mA's of current at a node 317 when $V_{316} \cong V_{314} - 0.5V$, the maximum steering line voltage value at output 316. This condition will forward bias the transistor 321 emitter-base junction, allowing transistor 341 to turn ON. With transistor 341 ON, the base potential of transistor 350 will be low enough to turn ON. Then a charge current is generated at output 360 that can be adjusted as a function of the value of resistor 348. The value of the charge current can be translated into a desired voltage value, using circuits known in the art such as a loop filter in the context of a PLL circuit, that is larger than the maximum steering line voltage value at output 316. Moreover, by adjusting the resistor 322, the source current at node 317 can be set to a desired level.

Case 2—Sink State: The internal charge pump of synthesizer IC 310 will typically sink several mA's of current at node 317, when $V_{316} \cong 0.5V$, the minimum steering line voltage value at output 316. This condition will forward bias the emitter base junction of transistor 332 allowing this transistor to turn ON. With transistor 332 ON, the base potential of transistor 352 will be high enough to turn ON. Then a discharge current is generated at output 360 that can be adjusted as a function of resistor 354. The value of the discharge current can be translated into a desired voltage value, using circuits known in the art such as a loop filter in the context of a PLL circuit, that is about the same as or smaller than the minimum steering line voltage value at output 316. Moreover, by adjusting resistor 328 the sink current at node 317 can be set to a desired level.

Case 3—Tri-state: The internal charge pump in the tri-state condition will not source or sink enough current to forward bias the emitter base junction of transistor 321 or transistor 332. In addition, the two voltage dividers of resistors 324 and 326 and of resistors 328 and 330 will provide about the same potential across each respective junction to ensure that transistors 321 and 332 are in the OFF state, such that the tri-state output at output 316 is replicated at output 360.

Finally, temperature compensation is achieved in the preferred embodiment of the external charge pump circuit 370 of FIG. 3 by diodes 334 and 346. To accomplish this, diode 334 must be of the same technology as transistor 352, and diode 346 must be of the same technology as transistor 350. Thus, in the preferred embodiment diodes 334 and 346 are of the bipolar technology.

Figure 4:
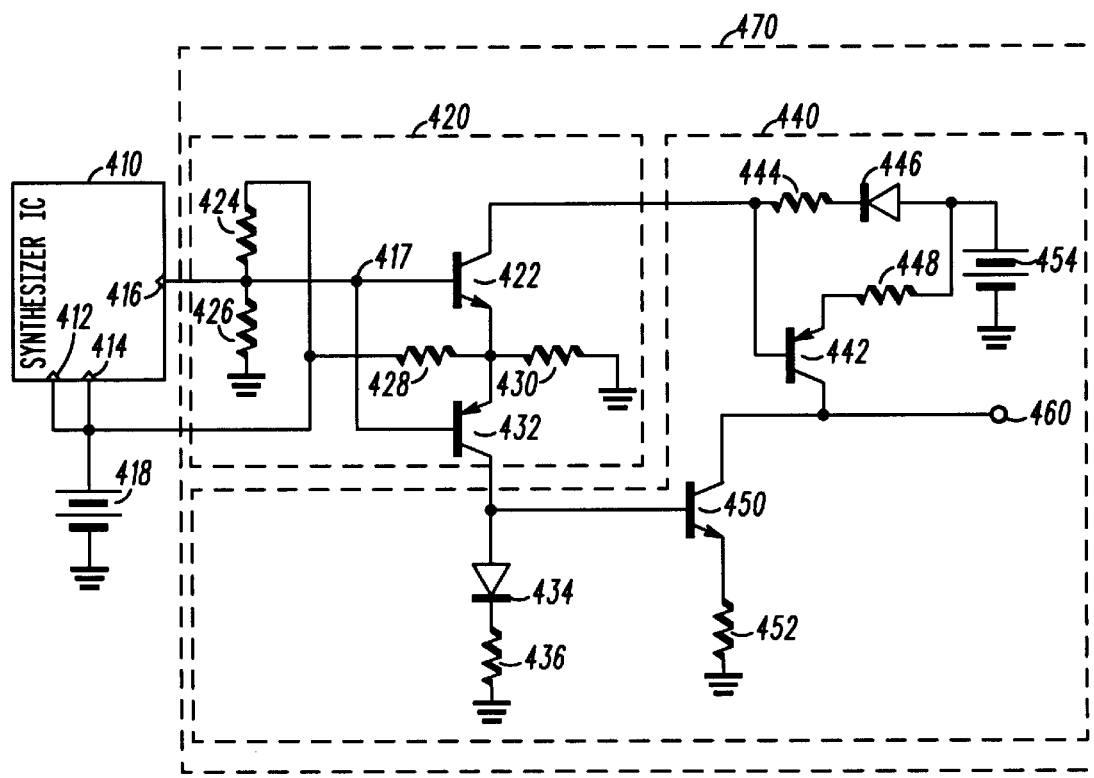
FIG. 4 illustrates a circuit diagram of a tri-state charge pump in accordance with another embodiment of the present invention.

FIG. 4 illustrates a tri-state charge pump 470 in accordance with a preferred embodiment of the present invention that is used to extend the steering line range of an internal charge pump (not shown) of a known synthesizer IC 410. Synthesizer IC 410 has a Vcc input 412 and a voltage input 414 for powering its internal charge pump. In this example Vcc is preferably, but not necessarily, equal to the voltage at input 414 ($V_{414}$), which is a predetermined direct current ("DC") voltage source 418. The condition of $V_{cc}=V_{414}$ is selected to reduce voltage requirements. Synthesizer IC 410 also has an output 416 that has three valid modes of operation: 1) Source, wherein a maximum voltage value of about $V_{414}-0.5V$ is generated at output 416; 2) Sink, wherein a minimum voltage value of about 0.5V is generated at output 416; and 3) Tri-state, wherein a tri-state output is generated at output 416.

The tri-state charge pump 470 according to the embodiment of the present invention, as illustrated in FIG. 4, comprises a switching circuit 420 coupled to output 416 and an output circuit 440 coupled to the switching circuit 420. The switching circuit 420 of the tri-state charge pump 470 comprises a first circuit for generating a first signal that is a function of the maximum steering line voltage at output 416, and a second circuit for generating a second signal that is a function of the minimum steering line voltage at output 416. This first circuit in the switching circuit 420 preferably includes a transistor 422 that is preferably a NPN type BJT transistor and a bias circuit comprising resistors 424, 426, 428 and 430. The second circuit in the switching circuit 420 preferably includes a PNP type BJT transistor 332 and the bias network having resistors 424, 426, 428 and 430.

The output circuit 440 comprises a current source circuit coupled to the first circuit at the collector of transistor 422 and configured for operating in an active or inactive state, and a current sink circuit coupled to the second circuit at the collector of transistor 432 and configured for operating in an active or inactive state. The current source circuit of the output circuit 440 preferably comprises a PNP type BJT transistor 442, resistors 444 and 448, a diode 446, and a voltage source 454, wherein the first signal generated by the first circuit of the switching circuit 420 is a current that causes the current source circuit of the output circuit 440 to operate in its active state for generating a charge current that can be translated into a first voltage having a value that is larger than the maximum value of the steering line voltage at output 416. The first voltage has a maximum saturation value that is about the same as voltage source 454. The current sink circuit of the output circuit 440 preferably comprises a NPN type BJT transistor 450, a diode 434, a resistor 436, and a resistor 452, wherein the second signal generated by the second circuit of the switching circuit 420 is a current that causes the current sink circuit of the output circuit 440 to operate in its active state for generating a discharge current that can be translated into a second voltage having a value that about the same as or that is smaller then the minimum value of the steering line voltage at output 416.

The detailed operation of the tri-state charge pump 470 according to the embodiment of the present invention, as illustrated in FIG. 4, is as follows. Preferably, the base voltage of transistors 422 and 432 are set to a fixed value that is about equal to $V_{414}/2$, using the voltage divider of resistors 424 and 426. Similarly, the emitter voltage of transistors 422 and 432 are set to a fixed value that is about equal to $V_{414}/2$, using the voltage divider of resistors 428 and 430, for creating a tri-state operation. Now consider the three modes of operation of the tri-state charge pump 470 of FIG. 4.

Case 1—Source State: The synthesizer IC 410's internal charge pump will typically source several mA's of current at a node 417 when $V_{416} \cong V_{414} -0.5V$, the maximum steering line voltage at output 416. This condition will forward bias the emitter-base junction of transistor 422 allowing current to flow through resistor 444 and drop the base voltage on transistor 442. With the lower base potential, transistor 442 will turn ON generating a charge current at output 460 that can be adjusted using resistor 448. The value of the charge current can be translated into a desired voltage value, using circuits known in the art such as a loop filter in the context of a PLL circuit, that is larger than the maximum steering line voltage value at output 416.

Case 2 (Sink State) and Case 3 (Tri-state) operate in a similar fashion as the tri-state charge pump circuit 370 of FIG. 3.

Finally, temperature compensation is achieved in the tri-state charge pump 470 of FIG. 4 using diodes 434 and 446. To accomplish this, diode 434 must be of the same technology as transistor 450, and diode 446 must be of the same technology as transistor 442. Thus, in the preferred embodiment diodes 434 and 446 are of the bipolar technology.

The difference between the tri-state charge pump 370 illustrated in FIG. 3 and the tri-state charge pump 470 illustrated in FIG. 4 is that transistor 432 is a NPN type BJT transistor, which also performs the switching function performed by transistor 341 in FIG. 3, thereby requiring one fewer transistor. However, the tri-state charge pump embodiments of FIGS. 3 and 4 are similar in that they may each be configured within a PLL circuit, wherein a loop filter may be used to translate the tri-state charge pump currents at outputs 360 and 460 to the desired voltages. Each embodiment illustrated of the present invention may also be used in other applications, such as re-clocking synthesizers, variable filters and antenna steering lines, and applications having dual state outputs. Finally, although the switching circuits described above with respect to FIGS. 3 and 4 were implemented using bipolar transistors, those of ordinary skill in the art will realize that the switching circuits may be implemented with other types of transistor technology, e.g., field effect transistors, wherein the switching circuit would generate voltage signals instead of current signals.

Figure 2:
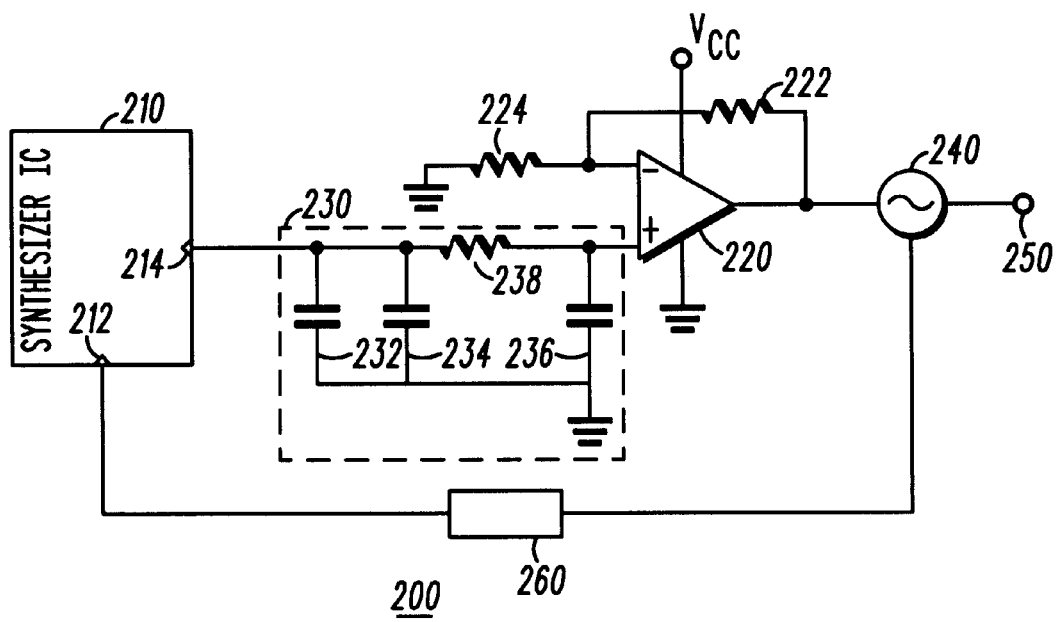
FIG. 2 illustrates a circuit diagram of a phase locked loop that includes a prior art external charge pump circuit.

There are a number of advantages to the present invention. One advantage of the present invention is that the tri-state charge pump can operate with a minimum supply voltage of $(V_{314}/2+0.7V)$ depending on the IC and the transistor technology. Another advantage of the present invention is that the maximum steering line swing is independent of the synthesizer IC supply voltage. Yet another advantage of the present invention is that the charge and discharge currents can easily be calculated and adjusted for various applications. Another advantage of the present invention is that the source and sink current requirements for the internal charge pump are adjustable through various resisters in the design. Still another advantage of the present invention is that the circuit is a low cost solution for wireless applications. Another advantage of the present invention is that the charge pump output replicates the tri-state output. Still another advantage of the present invention is that it is easily integrated into a single IC because of the absence of large capacitors in the circuit. A final key advantage of the present invention over the prior art charge pump described with respect to FIG. 2 is that it is implemented using a traditional current mode operation as compared to the voltage mode operation of the prior art op-amp circuit. This enables the user to control the amount of source (charge) and sink (discharge) current flowing to the loop filter. Controlling the current flow gives an extra degree of freedom in designing the loop filter, PLL phase margin, PLL stability, and PLL lock time. In addition, voltage mode operation allows for only two discrete output voltage values with a typical source and sink current. Whereas, the tri-state charge pump circuit according to the present invention allows for tri-state operation and, thus, when used in a PLL circuit with a loop filter, the loop filter is better able to smooth out the high and low transitions to produce a stable steering line voltage.

While the invention has been described in conjunction with specific embodiments thereof, additional advantages and modifications will readily occur to those skilled in the art. The invention, in its broader aspects, is therefore not limited to the specific details, representative apparatus, and illustrative examples shown and described. Various alterations, modifications and variations will be apparent to those skilled in the art in light of the foregoing description. For instance, instead of using BJT transistors, the present invention may be implemented with other transistor types, such as J-FET or MESFET. Thus, it should be understood that the invention is not limited by the foregoing description, but embraces all such alterations, modifications and variations in accordance with the spirit and scope of the appended claims.

What is claimed is:

1. In a device having an integrated circuit ("IC") with a single-pin output at which an output voltage is generated that has at least a minimum value and a maximum value, a charge pump circuit for extending the range of said IC output, comprising:

a switching circuit coupled to said single-pin IC output, comprising a first circuit for generating a first signal as a function of the maximum value of said output voltage and a second circuit for generating a second signal as a function of the minimum value of said output voltage; and an output circuit comprising a current source circuit coupled to said first circuit and configured for operating in an active or inactive state and a current sink circuit coupled to said second circuit and configured for operating in an active or inactive state, wherein said first signal causes said current source circuit to operate in its active state for generating a charge current that can be translated into a first voltage having a maximum saturation value that is larger than the maximum value of said IC output voltage, and said second signal causes said current sink circuit to operate in its active state for generating a discharge current that can be translated into a second voltage having a value that is about the same as or smaller than the minimum value of said IC output voltage.

2. The charge pump circuit of claim 1, wherein:

said first circuit comprises a first transistor having a first, second and third terminal, a resistor, and a bias circuit, and said first terminal is coupled to said single-pin IC output and to said bias circuit, said second terminal is coupled to said bias circuit, and said resistor is coupled between said third terminal and said current source circuit; and said second circuit comprises a second transistor having a first, second and third terminal and the bias circuit, and the first terminal of said second transistor is coupled to said bias circuit and to the second terminal of said first transistor, the second terminal of said second transistor is coupled to said single-pin IC output and said bias circuit, and the third terminal of said second transistor is coupled to said current sink circuit.

3. The charge pump circuit of claim 2, wherein said first and second transistors are bipolar junction transistors, and the first terminal of said first and second transistors is an emitter, the second terminal of said first and second transistors is a base, and the third terminal of said first and second transistors is a collector.

4. The charge pump circuit of claim 3, wherein said first and second transistors are PNP type bipolar junction transistors.

5. The charge pump circuit of claim 2, wherein said bias circuit comprises a plurality of resistors configured as a first and second voltage divider circuit, said first voltage divider circuit for coupling a first predetermined fixed voltage to the second terminal of said first transistor and the first terminal of the second transistor, and said second voltage divider circuit for coupling a second predetermined fixed voltage, that is about the same as said first predetermined fixed voltage, to the first terminal of said first transistor and to the second terminal of said second transistor.

6. The charge pump circuit of claim 1, wherein a tri-state output is generated at said single-pin IC output, and as a function of said tri-state output said switching circuit causes said current source circuit to operate in its inactive state and causes said current sink circuit to operate in its inactive state for replicating said tri-state output.

7. The charge pump circuit of claim 1, wherein said first signal is a first current signal and said second signal is a second current signal.

8. The charge pump circuit of claim 1, wherein:

said first circuit comprises a first transistor having a first, second and third terminal and a bias circuit, and the first terminal of said first transistor is coupled to a bias circuit, the second terminal of said first transistor is coupled to said single-pin IC output and to said bias circuit, and the third terminal of said first transistor is coupled to said current source circuit; and said second circuit comprises a second transistor having a first, second and third terminal and said bias circuit, and the first terminal of said second transistor is coupled to said bias circuit and to the first terminal of said first transistor, the second terminal of said second transistor is coupled to said single-pin IC output, said bias circuit and the second terminal of said first transistor, and the third terminal of said second transistor is coupled to said current sink circuit.

9. The charge pump circuit of claim 8, wherein said first and second transistors are bipolar junction transistors, and the first terminal of said first and second transistors is an emitter, the second terminal of said first and second transistors is a base, and the third terminal of said first and second transistors is a collector.

10. The charge pump circuit of claim 9, wherein said first transistor is an NPN type bipolar junction transistor, and said second transistor is a PNP type bipolar junction transistor.

11. The charge pump circuit of claim 8, wherein said bias circuit comprises a plurality of resistors configured as a first and second voltage divider circuit, said first voltage divider circuit for coupling a first predetermined fixed voltage to the first terminal of said first and second transistors, and said second voltage divider circuit for coupling a second predetermined fixed voltage, that is about the same as said first predetermined fixed voltage, to the second terminal of said first and second transistors.

12. A phase locked loop comprising:

an integrated circuit ("IC") having an input and a single-pin output at which an output voltage is generated that has at least a minimum value and a maximum value;

a charge pump circuit for extending the range of said IC output, comprising, a switching circuit coupled to said single-pin IC output, comprising a first circuit for generating a first signal as a function of the maximum value of said output voltage and a second circuit for generating a second signal as a function of the minimum value of said output voltage, and an output circuit comprising a current source circuit coupled to said first circuit and configured for operating in an active or inactive state and a current sink circuit coupled to said second circuit and configured for operating in an active or inactive state, wherein said first signal causes said current source circuit to operate in its active state for generating a charge current that can be translated into a first voltage having a maximum saturation value that is larger than the maximum value of said IC output voltage, and said second signal causes said current sink circuit to operate in its active state for generating a discharge current that can be translated into a second voltage having a value that is about the same as or smaller than the minimum value of said IC output voltage;

a filter circuit coupled to said charge pump circuit for translating said charge current into said first voltage and for translating said discharge current into said second voltage; and a voltage controlled oscillator circuit coupled between said filter circuit and the input to said IC.

* * * * *